(12) United States Patent
Heid et al.

(10) Patent No.: US 6,298,258 B1
(45) Date of Patent: Oct. 2, 2001

(54) METHOD AND APPARATUS FOR SPATIALLY RESOLVED MEASUREMENT OF THE ELECTRICAL ACTIVITY OF NERVE CELLS USING MAGNETIC RESONANCE

(75) Inventors: Oliver Heid, Gunzenhausen; Edgar Mueller, Heroldsbach, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/467,882

(22) Filed: Dec. 21, 1999

(30) Foreign Application Priority Data

Dec. 23, 1998 (DE) ............................................... 198 60 037

(51) Int. Cl.[7] .................................................. A61B 5/055
(52) U.S. Cl. ........................... 600/410; 324/307; 324/309
(58) Field of Search ............................ 600/410; 324/307, 324/309

(56) References Cited

U.S. PATENT DOCUMENTS

| | | |
|---|---|---|
| 4,719,425 * | 1/1988 | Ettinger .................................. 324/316 |
| 5,136,242 | 8/1992 | Abraham-Fuchs . |
| 5,392,210 | 2/1995 | Scholz . |
| 5,417,211 | 5/1995 | Abraham-Fuchs et al. . |
| 5,662,112 | 9/1997 | Heid . |

OTHER PUBLICATIONS

"Processing Strategies for Time–Course Data Sets in Functional MRI of the Human Brain," Bandettini et al., Magnetic Resonance in Medicine, vol. 30, 1993, pp. 161–173.

* cited by examiner

Primary Examiner—Brian L. Casler
(74) Attorney, Agent, or Firm—Schiff Hardin & Waite

(57) ABSTRACT

In a method for spatially resolved measurement of the electric activity of nerve cells by means of magnetic resonance, and a device for implementation of the method, a series of MR signal sets for the acquisition of spatially resolved MR signals is obtained, the phase shifts of the MR signals are determined, the phase shifts including shifts arising from magnetic field changes that are caused by the electric activity of nerve cells, and the event phase shifts of the MR signals are evaluated by a correlation of the MR signals with events that cause the electric activity.

7 Claims, 4 Drawing Sheets

METHOD AND APPARATUS FOR SPATIALLY RESOLVED MEASUREMENT OF THE ELECTRICAL ACTIVITY OF NERVE CELLS USING MAGNETIC RESONANCE

BACKGROUND OF THE INVENTION

1. Field of the Invention

The present invention is directed to a method for spatially resolved measurement of the electrical activity of nerve cells by means of magnetic resonance and a device for the implementation of the method.

2. Description of the Prior Art

Basically three methods are known for measuring the electric activity of living nerve cells.

Electric potentials are measured with the electroencephalogram (EEG). An extremely good time resolution is hereby possible. Attempts are made to achieve a spatial resolution with this method, but it is extremely difficult to determine the location of activity sources (foci) from the measured potentials, for example, at the scalp. A series of imponderable parameters seems to make an exact localization unpromising. The possibility of introducing needles into the brain for the localization is extremely limited and is associated with considerable unpleasantness and risks.

In magnetic encephalography (MEG), the magnetic fields that are triggered by neuronal functions are measured with highly sensitive magnetic field sensors (known as SQUIDs). For example, U.S. Pat. Nos. 5,392,210, 5,136,242 and 5,417,211 disclose such methods. A location determination is only incompletely possible here and a specific, extremely complex device is required. Therefore, this method has not yet gained prevalence.

A promising approach for the determination of nerve activities lies in the application of the magnetic resonance. This method is frequently designated as fMRI (functional magnetic resonance imaging). Brain activities can be displayed in local signal boosts of images that are acquired with T2-weighted sequences and T3-weighted sequences. In this technique, however, the signal change does not directly arise from the nerve activities, but arises from an activity-produced increase of the blood oxygen content. The currently applied methods of activity measuring by means of MR nevertheless offer advantages vis-a-vis the other above mentioned methods; in particular, a relatively precise localization of the activity is possible. A disadvantage, however, is that the primary effect, namely a current flow, or the magnetic field associated therewith, is not directly determined, but a secondary effect, namely the blood oxygenation that accompanies the nerve activity, is monitored. For example, one disadvantage is that a change in blood oxygenation follows the triggering neuronal event only with a delay.

The literature Bandettini et al., "Processing Strategies for Time-Course Data Sets in Functional MRI of the Human brain", Magnetic Resonance in Medicine, 1993, volume 30, page 161–173 describes an fMRT method wherein, for improvement of the signal-to-noise ratio, a cross correlation is carried out between the stimulation function and the time curve of MR images that are acquired with a single-shot-EPI method.

The method known from German OS 195 29 639 for the time resolved and spatially resolved presentation of functional brain activities also uses a time cross correlation between a stimulation function with image information for improvement of the signal-to-noise ratio. The stimulation function is non-periodic and exhibits as few as possible secondary maximums in its auto-correlation function. Thus, periodic disturbances (for example heartbeats, respiration) can be separated from the activity signal.

SUMMARY OF THE INVENTION

An object of the present invention is to provide a method and a device with which nerve activities can be tracked better than in the techniques described above.

The above object is achieved in accordance with the principles of the present invention in a method for spatially resolved measurement of electrical activity of nerve cells by means of magnetic resonance, and an apparatus for implementing the method, wherein a time series of sets of magnetic resonance signals is obtained, wherein the phase shifts of the MR signals are determined, and wherein phase shifts arising due to magnetic field changes caused by the electrical activity of nerve cells are identified by correlating the phase shifts of the MR signals with events which cause such electrical activity of nerve cells.

In contrast to conventional fMRI methods, the secondary effect of a signal boost due to an increased blood oxygenation is not determined in the inventive method and apparatus, but instead the phase shift of the MR signals induced by an activity-caused magnetic field change is determined. The magnetic field change, in turn, derives from the electric activity of living nerve cells. The magnetic field oscillations in the environment of the nerve cells are in the order of magnitude of 1 through 100 pT. Such magnetic field oscillations are too weak for a direct detection on the basis of the phase shift of the nuclear magnetic resonance signals. The phase shifts that arise from these magnetic field oscillations are dependent on the echo times. Given echo times of approximately 50 ms, the activity-produced phase shifts of the nuclear magnetic resonance signal lie in the range of 0.05 through 0.7 degrees. Phase shifts of less than 5 through 15 degrees, however, are submerged in the noise level that is usually present. Therefore, a useful signal is only received by acquiring during repeatedly occurring events that cause an electric activity, a series of MR signals and these signals are evaluated by a correlation analysis. The number of event-correlated MR signals necessary therefor can be 50 through approximately 10,000 depending on the intensity of the electric nerve activity.

Advantageously, the number of the events necessary for the correlation is produced by triggering the electric activity of nerve cells by external stimuli according to a stimulation function, and the thereby-caused phase shifts are determined by a time correlation with the stimulation function. Alternatively, a correlation between multiply successively occurring events and the measured phase shift of the nuclear magnetic resonance signals is also possible. For example, such events can be epileptic attacks. Then, an event-gating is used.

Advantageously, the signal-to-noise ratio can be determined by means of a time correlation of the phase shift of the nuclear magnetic resonance signals with a model over the time curve of the current through the nerve cells.

Further, an improvement of the signal-to-noise ratio is possible by a local correlation of the phase shift of the nuclear magnetic resonance signals with a model over the magnetic field curve of current dipoles of the electric activity of the nerve cells. The location of current dipoles that correspond to electric activities of nerve cells can also be determined on the basis of such a model.

DESCRIPTION OF THE PREFERRED EMBODIMENTS

Figure 1:
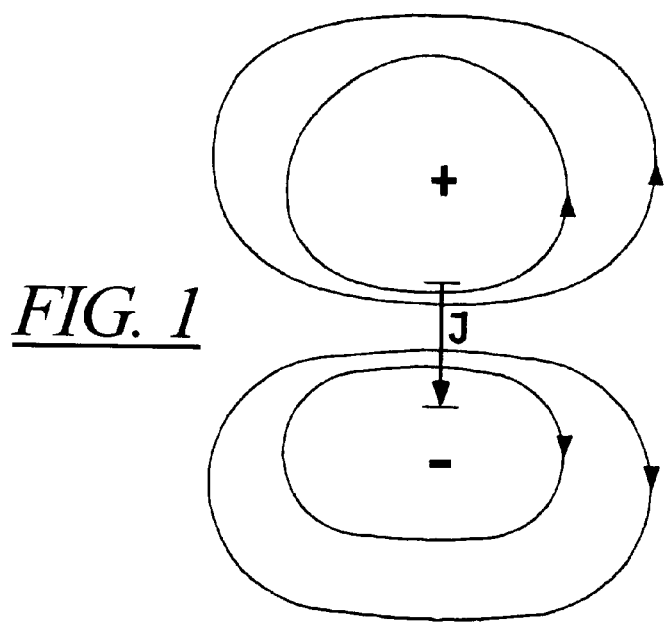
FIG. 1 illustrates a magnetic field curve, as an example, for a current dipole generated by activity of nerve cells.

FIG. 1 shows a characteristic current dipole for a neuronal activity center. The positive pole and the negative pole lie approximately 3 mm apart from each other, however, the current I cannot be directly evaluated by magnetic resonance, but only the induced magnetic field can be evaluated. FIG. 1 shows the corresponding magnetic field lines. As mentioned above, the magnetic field changes caused by neuronal activities lie in the order of magnitude of 1 through 100 pT.

Figure 2:
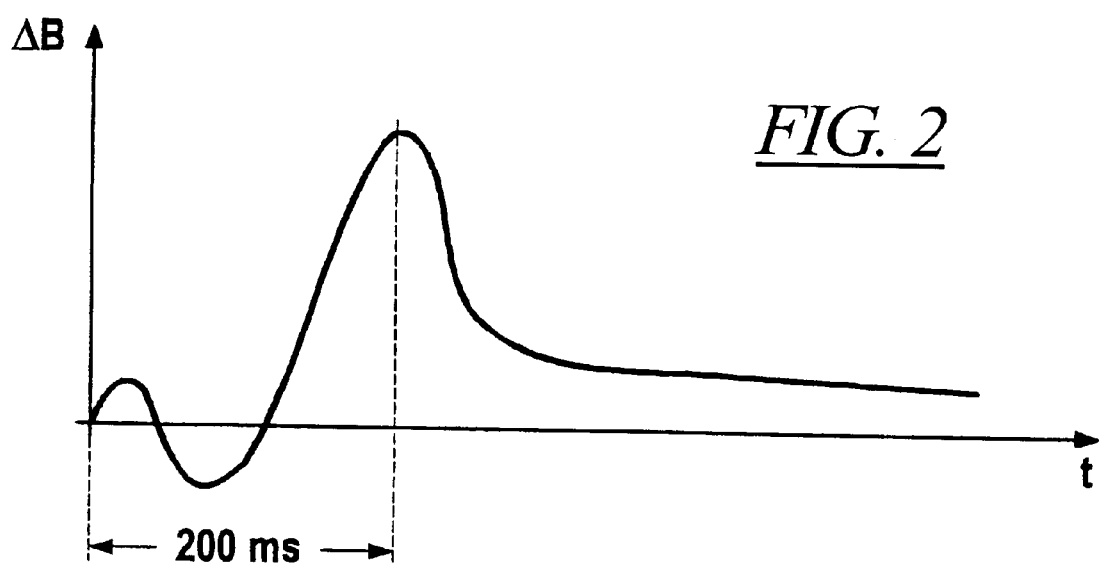
FIG. 2 illustrates a typical curve of an activity-produced magnetic field change over time.

FIG. 2 shows a typical time curve for the magnetic field change ΔB caused by a neuronal activity. The current maximum, and thus also the maximum of the magnetic field change, typically lie at approximately 200 ms after a triggering event.

Figure 3:
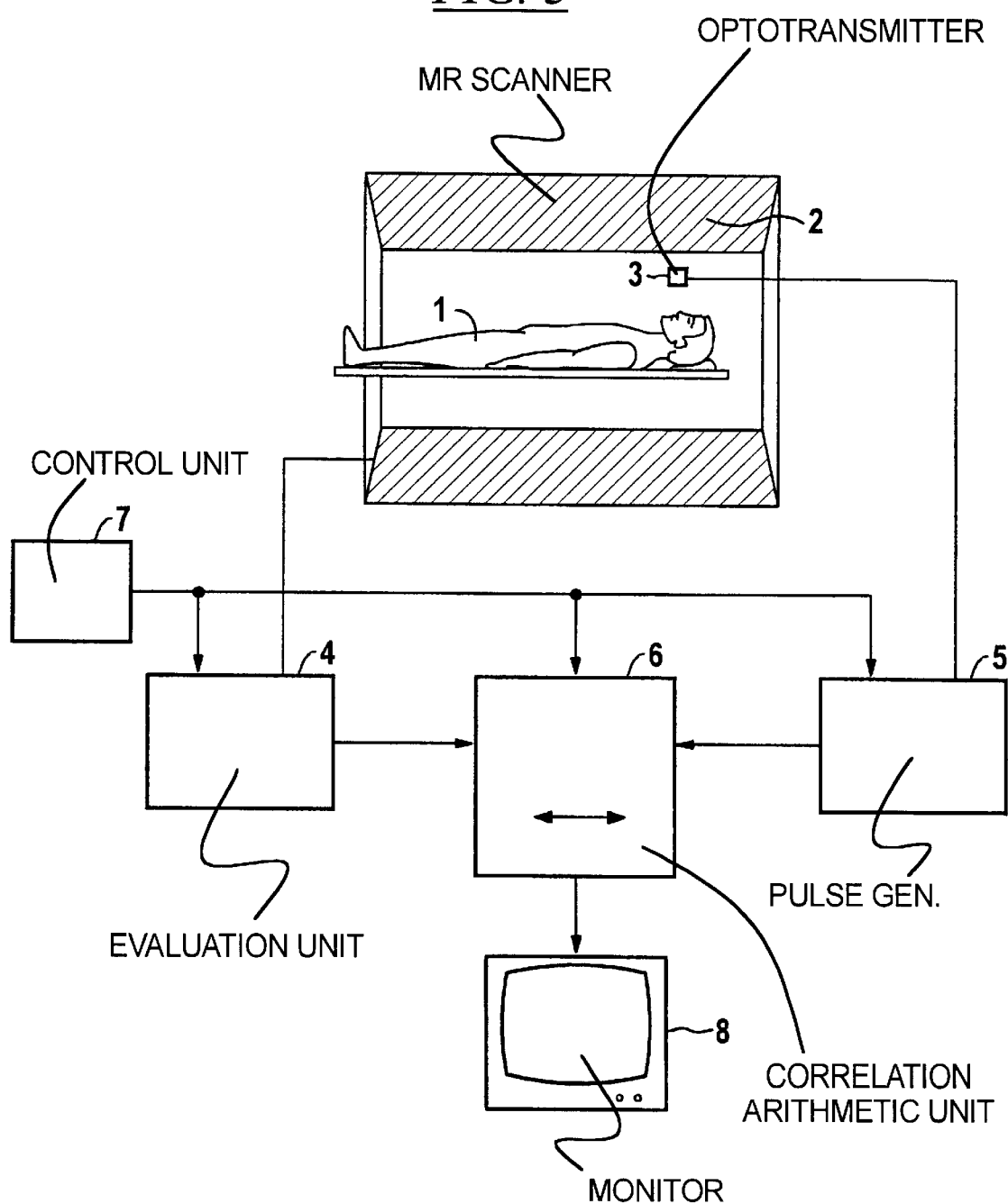
FIG. 3 schematically shows the structure of an MR apparatus for implementation of the inventive method.

Basically, the inventive method can be carried out with a conventional MR apparatus (inventively operated), with only a few additions (described in the following) being necessary. FIG. 3 schematically shows the structure of the MR device. A patient 1 is introduced in a scanner 2, which serves the purpose of generating a basic magnetic field and which (not shown for reasons of clarity) also has components built in for the generation of gradient fields, as well as high frequency antennae for the transmission and reception of high frequency pulses. The gradient coils and the high frequency antennae are driven by a control unit 7. To this extent, the structure corresponds to conventional devices whose function is presumed known.

For the stimulation of neuronal activities, a pulse generator 5 generates a stimulation function with which, for example, an opto-transmitter 3 is driven. Additionally, for example, an electric stimulation can ensue or the patient— for example by optical signals—can be induced to conduct movements corresponding to the stimulation function. The MR data acquired with an evaluation unit 4 and the stimulation function generated in the pulse generator 5 are correlated to one another in a correlation arithmetic unit 6. The data that are acquired in this way are displayed at a monitor 8. The evaluation unit 4, the correlation arithmetic unit 6 and the pulse generator 5 are controlled by the control unit 7.

To this extent, the structure of the MR apparatus is also known from, for example, the U.S. Pat. No. 5,662,112. As explained in greater detail below, however, the inventive method is based on a completely different physical effect.

An imaging sequence known as an EPI-(Echo Planar Imaging) sequence is especially appropriate for the acquisition of the MR raw data, as shown in the FIGS. 4 through 8. This sequence represents only one exemplary embodiment; other pulse sequences, such as turbo-spin-echo sequences, FISP sequences or FLASH sequences can also be used.

Figure 4:
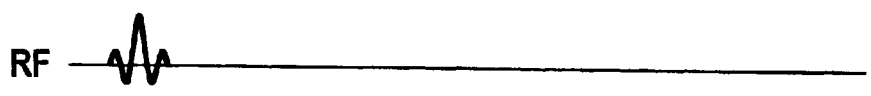
FIGS. 4 through 8 illustrate an example for a pulse sequence suitable for use in the inventive method.
Figure 5:
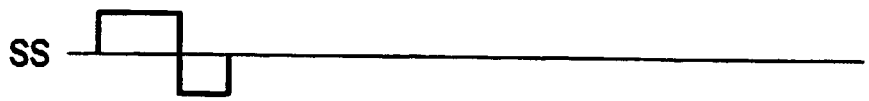
Figure 6:
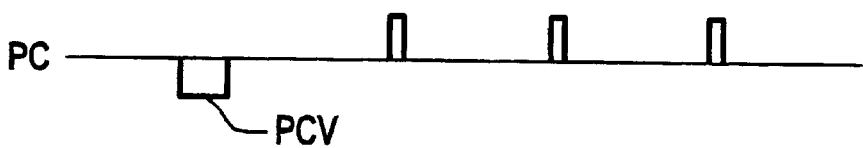
Figure 7:
Figure 8:

Given the EPI-sequence, a high frequency pulse RF1 is initially radiated according to FIG. 4. According to FIG. 5, a slice selection gradient SS is effective at the same time, so that only one slice of the examination object is excited, depending on the frequency spectrum of the high frequency pulse RF1 and on the intensity of the slice selection gradient SS. A negative sub-pulse follows the positive sub-pulse of the slice selection gradient SS; the dephasing caused by the positive sub-pulse is, in turn, canceled by said negative sub-pulse. According to the FIGS. 6 and 7, pre-dephasing pulses PCV, ROV are radiated respectively in the phase coding and in readout directions simultaneously with the negative sub-pulse of the slice selection gradient SS. Subsequently, a readout gradient OR with alternating polarity is activated. Due to the alternating sign of the readout gradient OR, the magnetic resonance signals are rephased again and again, and a signal S arises under each sub-pulse of the readout gradient OR. The signals S are respectively differently phase-coded by the phase being advanced from signal to signal by means of small phase-coding pulses PS between the signals. The signals are demodulated in a phase-sensitive manner and are digitalized in a raster. Depending on the signal, the received digital values are entered into a line of a raw data matrix. In the fastest version of the EPI method, known as "Single-Shot-EPI", sufficiently enough signals S are acquired after one single excitation in order to prepare a complete raw data set for an image. In a known way, the image can be acquired by two-dimensional Fourier-transformation from the raw data matrix.

Inventively, the phase information contained in the signals S is not only evaluated regarding the signal origin but is also evaluated regarding the magnetic field changes that are caused by neuronal activities. As explained above, it is not sufficient for this purpose to measure the activity-produced phase change only once. This change is so small that it would be submerged in the noise. As a result, a number of stimulations is carried out; the respectively received phase of the nuclear magnetic resonance signal is evaluated and a phase curve function g (t) is determined for each location pixel. Subsequently, a cross correlation function $\psi_{cross}$ of the stimulation function f (t) with the phase curve function g (t) is determined:

$$\psi_{cross} = \int f(t) \cdot g(t-\tau) \, dt$$

Figure 9:
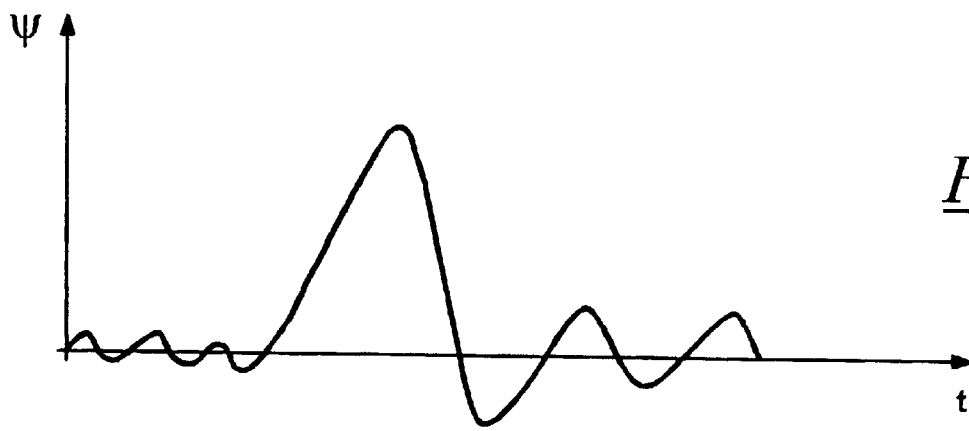
FIG. 9 illustrates typical curve of the correlation factor ψ for a pixel over time.

FIG. 9 shows the curve of this cross correlation function ψ. Due to the correlation function, it is possible to filter out the activity-produced phase shift from the MR signals. This, which activity-produced phase shift would otherwise be submerged in the noise. The phase shift can be displayed, for example, at a monitor given a corresponding number of stimulations and measurements. Depending on the level of the electric activity to be displayed, between 50 and 10,000 event-correlated measurements must be carried out.

The signal-to-noise ratio can be further improved, when specific information about the field distribution of magnetic dipoles and the time behavior of the neuronal magnetic fields is present. For this purpose, given an assumed superimposition of dipoles, for example, a model of the magnetic field curve can be prepared and the field curve measured on the basis of the phase shift can be then correlated with this model. Such models are also based on magneto-encephalography with the aid of magnetic field detectors. For example, the U.S. Pat. No. 5,417,211 describes this method.

FIG. 2 shows the typical time curve of the magnetic field change. The signal-to-noise ratio can also be improved by correlating the measured phase position of the MR signals with such a model over the time curve. Given such a model method, the actual location of interest of the dipole can be determined from the measured field curve. Since the magnetic field is measured here directly at the location of origin—contrary to the MEG method with magnetic field detectors—and the result therefore is not as dependent on assumptions and boundary conditions regarding the model taken as a basis, the actual location of the magnetic dipole can be determined more reliably and exactly.

Figure 10:
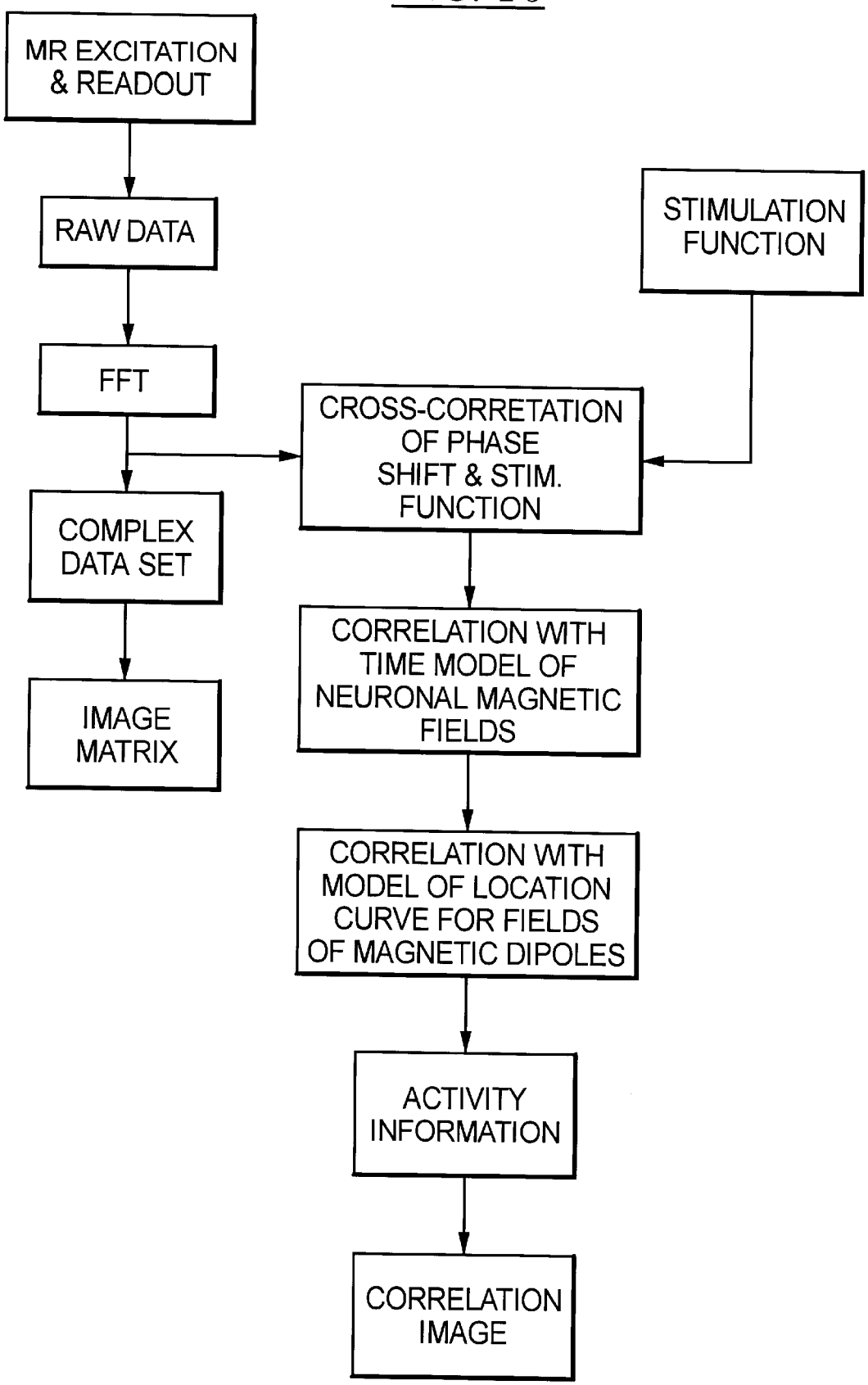
FIG. 10 is a flow chart of the inventive method.

FIG. 10 shows a flow chart for the determination of neuronal activities according to the invention. Due to the excitation and readout of nuclear magnetic resonance signals, raw data are acquired. According to conventional methods, complex data sets in the spatial domain are acquired from these by FFT (Fast Fourier Transform)-transformation. A magnitude data set and a phase data set are determined from these complex data sets. An image matrix is created on the basis of the magnitude data set. As to the phase data set, a cross correlation of the phase position of these raw data ensues with a stimulation function. Further, a correlation with a time model ensues for the magnetic fields caused by neuronal activities. Finally, a correlation with a model of the location curve of the magnetic fields of magnetic dipoles ensues. Due to this correlation, an item of information about neuronal activities is filtered out from the raw data and, spatially resolved, is presented in a functional image.

It must be pointed out that the method can also be carried out by co-registration of spontaneously occurring events, for example, due to epileptic attacks. In this case, an event function replaces the stimulation function.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for spatially resolved measurement of electrical activity of nerve cells, comprising the steps of:

obtaining a series of magnetic resonance signals from an examination subject, said magnetic resonance signals respectively exhibiting phase shifts;

identifying the phase shifts of the magnetic resonance signals, the identified phase shifts including phase shifts which arise due to electrical activity of nerve cells in said examination subject; and identifying said phase shifts which arise due to the electrical activity of nerve cells in said examination subject by correlating said phase shifts of said magnetic resonance signals with a time curve of events which cause said electrical activity of nerve cells in said examination subject.

2. A method as claimed in claim 1 comprising externally triggering electrical activity of nerve cells in said examination subject by subjecting said examination subject to a stimulation function.

3. A method as claimed in claim 1 comprising correlating said phase shifts of said magnetic resonance signals with multiply successively occurring events which cause said electrical activity of nerve cells in said examination subject.

4. A method as claimed in claim 1 comprising correlating said magnetic resonance signals with a modeled time curve of said events which cause said electrical activity of nerve cells in said examination subject.

5. A method as claimed in claim 1 comprising location correlating said phase shifts of said magnetic resonance signals with a modeled magnetic field curve of current dipoles representing said electrical activity of said nerve cells in said examination subject.

6. A method as claimed in claim 1 comprising identifying respective locations of current dipoles corresponding to said electrical activity of said nerve cells in said examination subject by generating a magnetic field curve from said phase shifts of said magnetic resonance signals and comparing said magnetic field curve to a modeled magnetic field curve of said current dipoles.

7. A magnetic resonance tomography apparatus for spatially resolved measurement of electrical activity of nerve cells in an examination subject, comprising:

a magnetic resonance scanner for obtaining a time series of magnetic resonance signals, said magnetic resonance signals respectively exhibiting phase shifts;

means for identifying the phase shifts of said magnetic resonance signals, said phase shifts including phase shifts arising from said electrical activity of nerve cells; and a correlator for correlating said phase shifts of said magnetic resonance signals with events which cause said electrical activity of nerve cells to identify said phase shifts arising from said electrical activity of nerve cells.

* * * * *